United States Patent
Park (10) Patent No.: US 7,542,353 B2
(45) Date of Patent: Jun. 2, 2009

(54) FLASH MEMORY DEVICE AND ERASE METHOD THEREOF

(75) Inventor: Jin Su Park, Daegu (KR)

(73) Assignee: Hynix Semiconductor Inc., Icheon-si, Kyoungki-do (KR)

(*) Notice: Subject to any disclaimer, the term of this patent is extended or adjusted under 35 U.S.C. 154(b) by 268 days.

(21) Appl. No.: 11/488,149

(22) Filed: Jul. 18, 2006

(65) Prior Publication Data

US 2007/0263457 A1 Nov. 15, 2007

(30) Foreign Application Priority Data

May 12, 2006 (KR) ...................... 10-2006-0042971

(51) Int. Cl.
*G11C 11/34* (2006.01)

(52) U.S. Cl. .............................. 365/185.29; 365/185.11

(58) Field of Classification Search ............ 365/185.29, 365/185.11, 185.12, 185.23
See application file for complete search history.

(56) References Cited

U.S. PATENT DOCUMENTS

| 5,995,417 | A | * | 11/1999 | Chen et al. | ............. | 365/185.29 |
| 6,101,123 | A | * | 8/2000 | Kato et al. | ............. | 365/185.11 |
| 6,400,603 | B1 | * | 6/2002 | Blyth et al. | ............ | 365/185.12 |
| 6,498,750 | B2 | * | 12/2002 | Terada | ................... | 365/185.11 |
| 6,591,327 | B1 | * | 7/2003 | Briner et al. | ................ | 711/103 |

FOREIGN PATENT DOCUMENTS

| JP | 11-273368 | 10/1999 |
| JP | 2002-133877 | 5/2002 |
| JP | 2005-222228 | 8/2005 |
| JP | 2005-267821 | 9/2005 |
| KR | 1998-0071696 | 10/1998 |
| KR | 100204810 | 3/1999 |
| KR | 1020010103072 | 11/2001 |
| KR | 1020040071574 | 8/2004 |
| KR | 1020050079210 | 8/2005 |
| KR | 1020050096445 | 10/2005 |
| KR | 10200600753961 | 7/2006 |
| KR | 1020060021471 | 8/2006 |

* cited by examiner

*Primary Examiner*—Anh Phung
(74) *Attorney, Agent, or Firm*—Lowe Hauptman Ham & Berner, LLP (57) ABSTRACT

A flash memory device and an erase method thereof, in which the size of a memory cell block can be selectively changed during an erase operation. The flash memory device includes a plurality of memory cell blocks, an X-decoder, and a plurality of block selection units. The X-decoder decodes block address signals, page address signals, and block size change signals in response to one of a program command, a read command, and an erase command, generates a plurality of block selection signals and word line bias voltages according to the decoding result, and outputs the word line bias voltages to a plurality of global word lines, respectively. During the erase operation, the size of an erased memory cell block is decided according to word line bias voltages output from the X-decoder. During the erase operation, at least one of the plurality of block selection units selects at least one of the plurality of memory cell blocks. Accordingly, the size of a memory cell block of a flash memory device can be changed in various ways depending on operating characteristics of products.

36 Claims, 5 Drawing Sheets

FLASH MEMORY DEVICE AND ERASE METHOD THEREOF

BACKGROUND

1. Field of the Invention

The present invention relates generally to semiconductor memory devices, and more particularly, to a flash memory device and an erase method thereof.

2. Discussion of Related Art

In general, a flash memory device includes a plurality of memory cell blocks. Each of the plurality of memory cell blocks includes a plurality of pages. Each of the plurality of pages includes a plurality of memory cells sharing one word line. The flash memory device executes a program operation, a read operation, and an erase operation. In general, the program operation and the read operation of the flash memory device are executed on a page basis and the erase operation of the flash memory device is executed on a memory-cell-block basis. Accordingly, during the program operation and the read operation, address signals corresponding to a corresponding page are inputted to the flash memory device in order to select a corresponding page to be programmed or read. However, since the erase operation is executed on a memory-cell-block basis, address signals corresponding to a corresponding memory cell block are inputted to the flash memory device during the erase operation.

Figure 1:
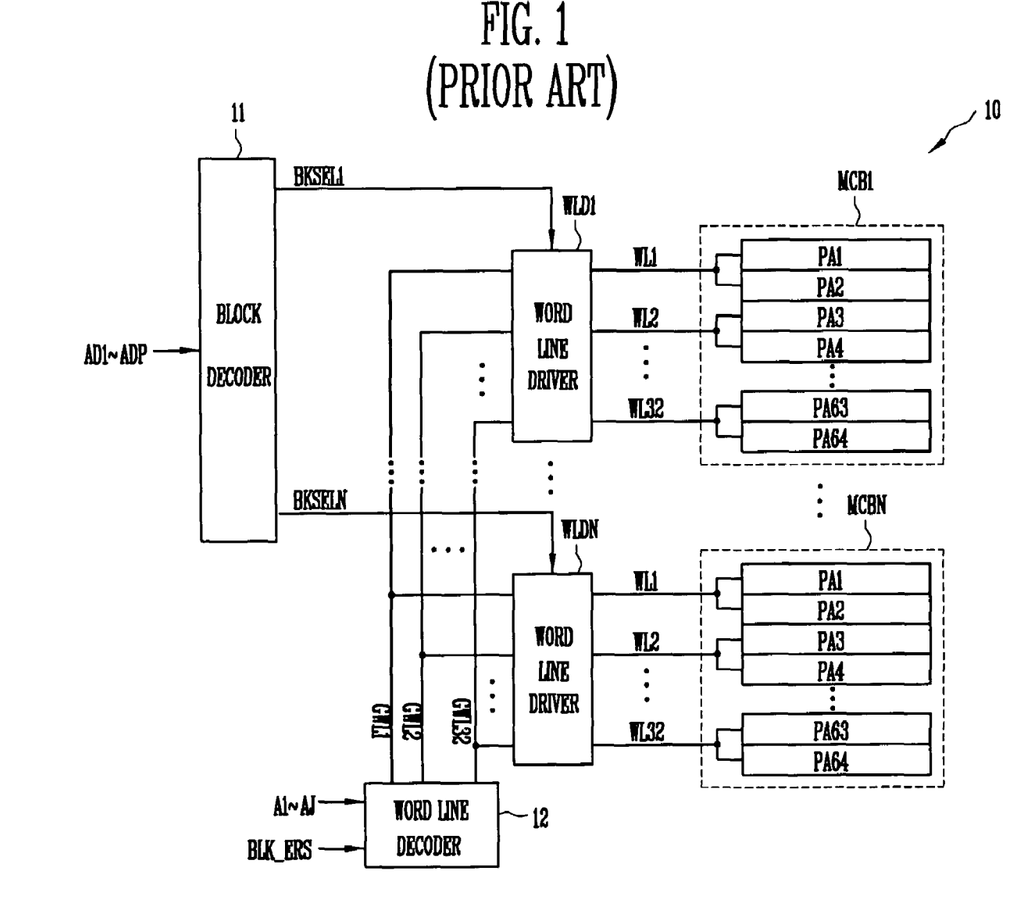
FIG. 1 is a block diagram schematically showing the structure of a flash memory device in the related art.

An erase operation process of a flash memory device 10 will be described in short below with reference to FIG. 1.

A block decoder 11 decodes block address signals AD1 to ADP (P is an integer), enables one (for example, BKSEL1) of a plurality of block selection signals BKSEL1 to BKSELN and disables the remaining block selection signals BLSEL2 to BKSELN. A word line driver WLD1 connects global word lines GWL1 to GWL32 to local word lines WL1 to WL32 of a memory cell block MCB1, respectively, in response to the block selection signal BKSEL1. Furthermore, word line drivers WLD2 to WLDN separate local word lines WL1 to WL32 of memory cell blocks MCB2 to MCBN from the global word lines GWL1 to GWL32, respectively, in response to block selection signals BLSEL2 to BKSELN. Consequently, the memory cell block MCB1 is selected as a memory cell block to be erased.

Thereafter, a word line decoder 12 supplies the global word lines GWL1 to GWL32 with erase voltages, respectively, in response to a block erase signal BLK_ERS. As a result, the erase voltages are transferred to the local word lines WL1 to WL32 of the memory cell block MCB1, respectively, through the global word lines GWL1 to GWL32, so that the erase operation of the memory cell block MCB1 is performed.

As described above, the erase operation of the flash memory device 10 is executed on a-memory-cell-block basis. The size of one memory cell block is fixed by a physical structure decided in the process of designing a flash memory device. In other words, the number of pages included in one memory cell block is decided by the number of global word lines decided in the designing process. Accordingly, it is difficult to change the size of a memory cell block included in a flash memory device after the flash memory device is fabricated. FIG. 1 illustrates an example in which each of the memory cell blocks MCB2 to MCBN includes 64 pages PA 1 to PA 64 (i.e., when the number of global word lines is 32).

Meanwhile, there is a need for changing the size of a memory cell block depending on operating characteristics of products to which a flash memory device is applied. For example, in the case where a flash memory device is applied to a semiconductor device in which an application program for processing a large quantity of data at once is executed, it is preferred that the flash memory device includes memory cell block having an increased size. Furthermore, in the case where a flash memory device is applied to a semiconductor device in which an application program for processing a small quantity of data at once is executed, it is preferred that the flash memory device includes memory cell block having a reduced size.

However, in the related art flash memory device, the size of a memory cell block is fixed by the physical structure. Therefore, to change the size of the memory cell block, a flash memory device must be fabricated newly. In this case, since flash memory devices fabricated suitably for specific products (i.e., fabricated to include a memory cell block of a size suitable for specific products) may not be suitable for other products, they have limited applications.

SUMMARY OF THE INVENTION

An embodiment of the present invention is that it provides a flash memory device in which the size of a memory cell block can be selectively changed by changing the number of global word lines for supplying erase voltages according to block size change signals during an erase operation without changing its physical structure.

Another embodiment of the present invention is that it provides an erase method of a flash memory device in which the size of a memory cell block can be selectively changed by changing the number of global word lines for supplying erase voltages according to block size change signals during an erase operation without changing its physical structure.

A flash memory device according to an aspect of the present invention includes a plurality of memory cell blocks, an X-decoder, and a plurality of block selection units. Each of the plurality of memory cell blocks includes a plurality of pages and each of the plurality of pages has a plurality of memory cells. The X-decoder decodes block address signals, page address signals, and block size change signals in response to one of a program command, a read command, and an erase command, generates a plurality of block selection signals and word line bias voltages according to the decoding result, and outputs the word line bias voltages to a plurality of global word lines, respectively. The plurality of block selection units are disposed in the plurality of memory cell blocks, respectively, one by one, and connect the plurality of global word lines, a global drain select line, and a global source select line to the plurality of memory cell blocks, respectively, in response to the plurality of block selection signals, respectively, thereby selecting the plurality of memory cell blocks, respectively. During an erase operation of the flash memory device, at least one of the plurality of block selection units selects at least one of the plurality of memory cell blocks, and the X-decoder outputs the word line bias voltages such that a part of or all the plurality of pages included in at least one memory cell block selected during the erase operation. Furthermore, the size of an erased memory cell block is decided according to the word line bias voltages output from the X-decoder during the erase operation.

A flash memory device according to another aspect of the present invention includes a plurality of planes and an X-decoder. Each of the plurality of planes includes a plurality of memory cell blocks and a plurality of block selection units. Each of the plurality of memory cell blocks includes a plurality of pages and each of the plurality of pages has a plurality of memory cells. The plurality of block selection units are disposed in the plurality of memory cell blocks, respectively, one by one, and connect the plurality of global word lines, a global drain select line, and a global source select line to the plurality of memory cell blocks, respectively, in response to block selection signals of one of the plurality of groups, respectively, thereby selecting the plurality of memory cell blocks, respectively. The X-decoder decodes block address signals, page address signals, and block size change signals in response to one of a program command, a read command, and an erase command and a plane selection signal, generates word line bias voltages and block selection signals of at least one of a plurality of groups according to the decoding result, and outputs the word line bias voltages to a plurality of global word lines, respectively. During an erase operation of the flash memory device, at least one of the plurality of block selection units selects at least one of the plurality of memory cell blocks. The X-decoder outputs the word line bias voltages such that a part of or all the plurality of pages included in at least one memory cell block selected during the erase operation. The size of an erased memory cell block is decided according to the word line bias voltages output from the X-decoder during the erase operation.

According to further another aspect of the present invention, there is provided an erase method of a flash memory device, including the steps of, including the steps of generating an erase command in response to a first command signal, generating block size change signals in response to a second command signal, generating block address signals and page address signals based on external address signals, and selectively changing the size of an erase memory cell block and erasing the erase memory cell block, in response to the erase command, the block size change signals, the block address signals, and the page address signals.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The present invention will now be described in detail in connection with certain exemplary embodiments with reference to the accompanying drawings.

Figure 2:
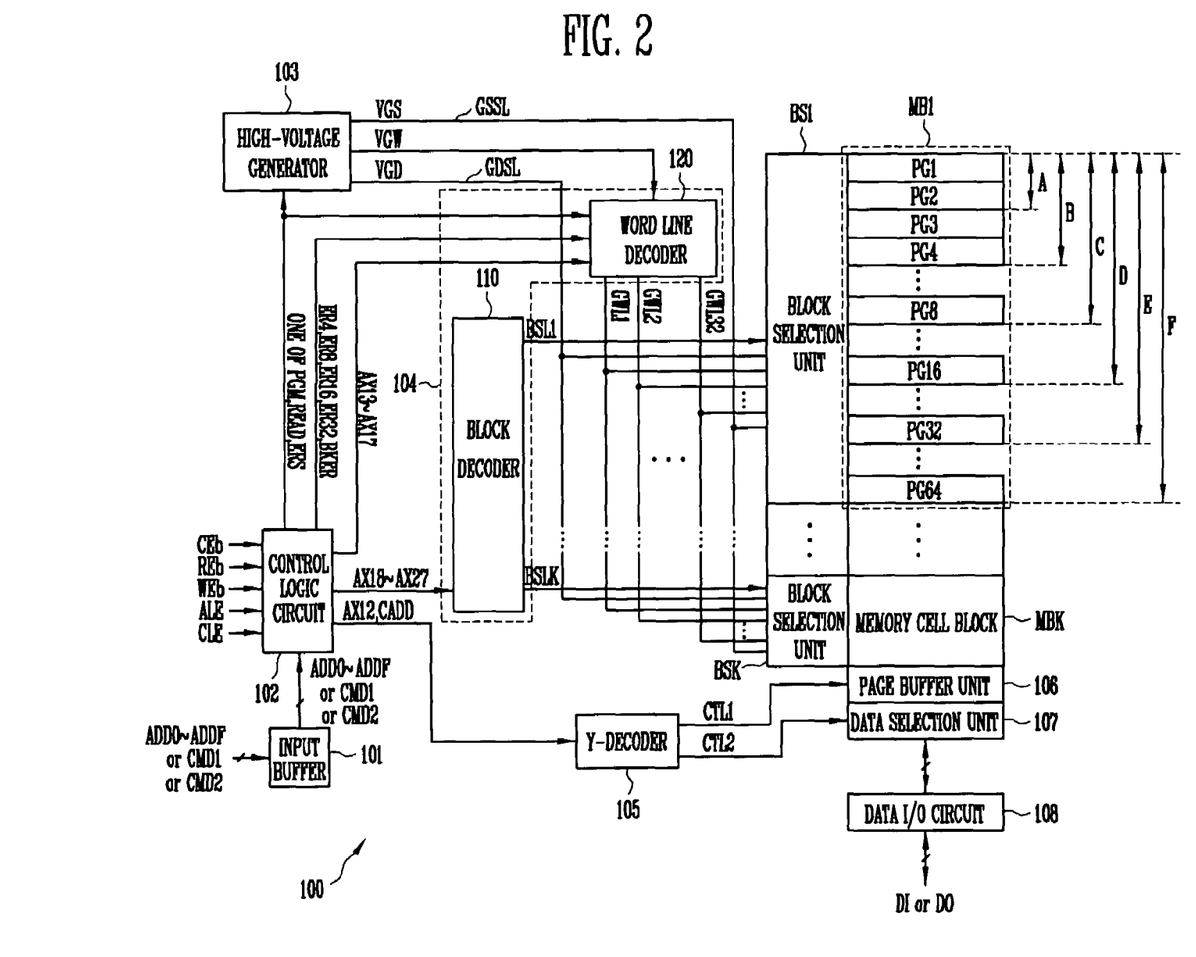
FIG. 2 is a block diagram showing the structure of a flash memory device according to an embodiment of the present invention.

FIG. 2 is a block diagram showing the structure of a flash memory device according to an embodiment of the present invention.

Referring to FIG. 2, a flash memory device 100 includes memory cell blocks MB1 to MBK, an input buffer 101, a control logic circuit 102, a high-voltage generator 103, an X-decoder 104, block selection units BS1 to BSK, a Y-decoder 105, a page buffer unit 106, a data selection unit 107, and a data I/O circuit 108.

The memory cell blocks MB1 to MBK have the same structure and operation. Each of the memory cell blocks MB1 to MBK includes pages PG1 to PG64. There is shown in FIG. 2 an example in which each of the memory cell blocks MB1 to MBK includes 64 pages. However, the number of pages included in each of the memory cell blocks MB1 to MBK may be increased or decreased.

The input buffer 101 receives one of command signals CMD1 and CMD2, or external address signals ADD0 to ADDF (F is an integer) and outputs it to the control logic circuit 102.

The control logic circuit 102 receives the command signal CMD1 or CMD2 or the external address signals ADD0 to ADDF in response to external control signals, such as a chip enable signal CEb, a read enable signal REb, a write enable signal WEb, an address latch enable signal ALE, and a command latch enable signal CLE. The control logic circuit 102 generates one of a program command PGM, a read command READ, and an erase command ERS in response to the command signal CMD1. The control logic circuit 102 also generates block size change signals ER4, ER8, ER16, ER32, and BKER in response to the command signal CMD2. In more detail, the control logic circuit 102 enables one of the block size change signals ER4, ER8, ER16, ER32, and BKER in response to the command signal CMD2. Furthermore, the control logic circuit 102 generates block address signals AX18 to AX27, page address signals AX13 to AX17, and column address signals AX12, CADD based on the external address signals ADD0 to ADDF.

The high-voltage generator 103 generates a word line bias voltage VGW, a drain bias voltage VGD, and a source bias voltage VGS in response to one of the program command PGM, the read command READ, and the erase command ERS. In more detail, the high-voltage generator 103 generates a program voltage VPGM and a program pass voltage VPASS as the word line bias voltage VGW, and generates the drain bias voltage VGD and the source bias voltage VGS corresponding to the program operation, in response to the program command PGM. Furthermore, the high-voltage generator 103 generates a read voltage VRD and a read pass voltage VRP as the word line bias voltage VGW, and generates the drain bias voltage VGD and the source bias voltage VGS corresponding to the read operation in response to the read command READ. Furthermore, the high-voltage generator 103 generates an erase voltage VER and an erase-prohibition voltage VERP as the word line bias voltage VGW, and generates the drain bias voltage VGD and the source bias voltage VGS corresponding to the erase operation in response to the erase command ERS.

Preferably, the erase-prohibition voltage VERP may be higher than the erase voltage VER. The high-voltage generator 103 generates the word line bias voltages VGW1 to VGW32, the drain bias voltage VGD, and the source bias voltage VGS corresponding to any one of the program operation, the read operation, and the erase operation of the flash memory device 100. The high-voltage generator 103 outputs the word line bias voltages VGW1 to VGW32 to the X-decoder 104 and outputs the drain bias voltage VGD and the source bias voltage VGS to the global drain select line GDSL and the global source select line GSSL, respectively.

The X-decoder 104 includes a block decoder 110 and a word line decoder 120. The block decoder 110 decodes the block address signals AX18 to AX27 and generates a plurality of block selection signals BSL1 to BSLK (K is an integer)

according to the decoding result. In more detail, the block decoder 110 enables at least one of the block selection signals BSL1 to BSLK. The word line decoder 120 decodes the page address signals AX13 to AX17 and the block change signals ER4, ER8, ER16, ER32, and BKER in response to one of the program command PGM, the read command READ, and the erase command ERS and outputs the word line bias voltages VGW1 to VGW32 to global word lines GWL1 to GWL32, respectively, according to the decoding result. There is shown in FIG. 2 an example in which the flash memory device 100 includes the 32 global word lines GWL1 to GWL32. However, the number of the global word lines included in the flash memory device 100 may be increased or decreased, if appropriate.

The block selection units BS1 to BSK are disposed in the memory cell blocks MB1 to MBK, respectively. The block selection units BS1 to BSK have the same structure and operation. The block selection units BS1 to BSK connect the global word lines GWL1 to GWL32, the global drain select line GDSL, and the global source select line GSSL to the memory cell blocks MB1 to MBK, respectively, in response to the block selection signals BSL1 to BSLK, respectively, thereby selecting the memory cell blocks MB1 to MBK, respectively. Preferably, when at least one (for example, BS1) of the block selection units BS1 to BSK selects at least one (for example, MB1) of the memory cell blocks MB1 to MBK, the remaining block selection units BS2 to BSK do not select the memory cell blocks MB2 to MBK.

The Y-decoder 105 outputs a control signal CTL1 based on the column address signal AX12 and outputs a control signal CTL2 based on the column address signal CADD.

The page buffer unit 106 operates in response to the control signal CTL1.

The data selection unit 107 outputs data (not shown), which are received from the data I/O circuit 108, to a part of a plurality of page buffers PB1 to PBU included in the page buffer unit 106, or selects data (not shown) from a part of the plurality of page buffers PB1 to PBU and outputs the selected data to the data I/O circuit 108, in response to the control signal CTL2 during the program operation or the read operation of the flash memory device 100.

The data I/O circuit 108 outputs output data DO, which are received from the data selection unit 107, to an external device (not shown) and outputs input data DI, which are received from the external device, to the data selection unit 107.

Figure 3:
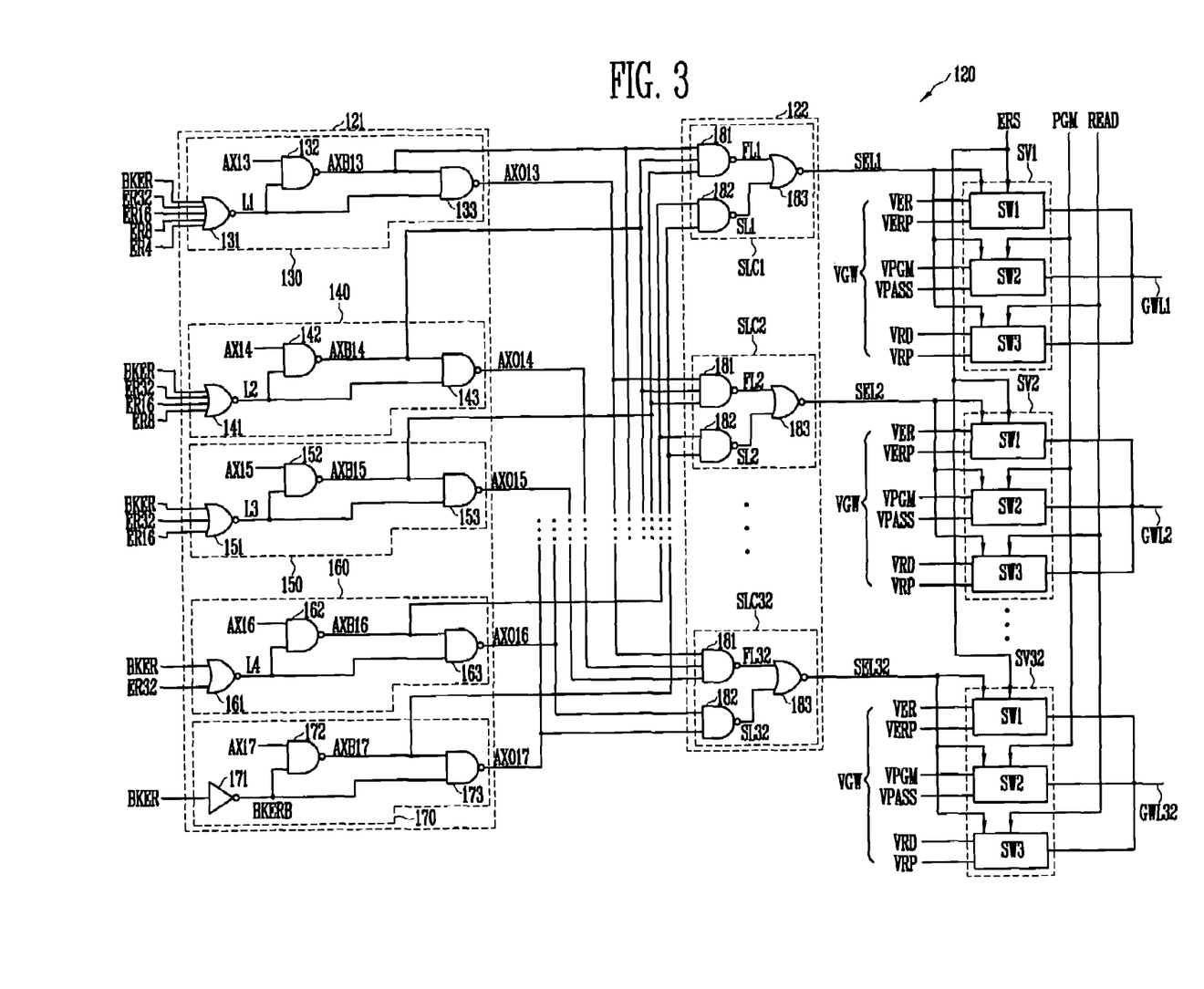
FIG. 3 is a detailed circuit diagram of a word line decoder shown in FIG. 2.

FIG. 3 is a detailed circuit diagram of the word line decoder shown in FIG. 2. Referring to FIG. 3, the word line decoder 120 includes a first logic calculation unit 121, a second logic calculation unit 122, and voltage selection units SV1 to SV32.

The first logic calculation unit 121 logically calculates the page address signals AX13 to AX17 and the block change signals ER4, ER8, ER16, ER32, and BKER and outputs internal logic signals AXB13 to AX17, AXO13 to AXO17. In more detail, the first logic calculation unit 121 includes logic circuits 130 to 170.

The logic circuit 130 includes a NOR gate 131 and NAND gates 132 and 133. The NOR gate 131 outputs a logic signal L1 in response to the block change signals ER4, ER8, ER16, ER32, and BKER. Preferably, when all the block change signals ER4, ER8, ER16, ER32, and BKER are logical low, the NOR gate 131 outputs the logic signal L1 as a logical high. Furthermore, when at least one of the block change signals ER4, ER8, ER16, ER32, and BKER is logical high, the NOR gate 131 outputs the logic signal L1 as logical low. The NAND gate 132 outputs the internal logic signal AXB13 in response to the logic signal L1 and the page address signal AX13. The NAND gate 132 outputs the internal logic signal AXB13 as logical low when both the logic signal L1 and the page address signal AX13 are logical high. Furthermore, when one of the logic signal L1 and the page address signal AX13 is logical low, the NAND gate 132 outputs the internal logic signal AXB13 as logical high. The NAND gate 133 outputs the internal logic signal AXO13 in response to the internal logic signal AXB13 and the logic signal L1. The logic circuits 140 to 160 have the same structure and operation as those of the logic circuit 130. Accordingly, the structure and operation of each of the logic circuits 140 to 160 will be described in short in order to avoid redundancy.

The logic circuit 140 includes a NOR gate 141 and NAND gates 142 and 143. The NOR gate 141 outputs a logic signal L2 in response to the block change signals ER8, ER16, ER32, and BKER. The NAND gate 142 outputs the internal logic signal AXB14 in response to the logic signal L2 and the page address signal AX14. The NAND gate 143 outputs the internal logic signal AXO14 in response to the internal logic signal AXB14 and the logic signal L2.

The logic circuit 150 includes a NOR gate 151 and NAND gates 152 and 153. The NOR gate 151 outputs a logic signal L3 in response to the block change signals ER16, ER32, and BKER. The NAND gate 152 outputs the internal logic signal AXB15 in response to the logic signal L3 and the page address signal AX15. The NAND gate 153 outputs the internal logic signal AXO15 in response to the internal logic signal AXB15 and the logic signal L3.

The logic circuit 160 includes a NOR gate 161 and NAND gates 162 and 163. The NOR gate 161 outputs a logic signal L4 in response to the block change signals ER32, and BKER. The NAND gate 162 outputs the internal logic signal AXB16 in response to the logic signal L4 and the page address signal AX16. The NAND gate 163 outputs the internal logic signal AXO16 in response to the internal logic signal AXB16 and the logic signal L4.

The logic circuit 170 includes an inverter 171 and NAND gates 172 and 173. The inverter 171 inverts the block size change signal BKER and outputs an inverted block size change signal BKERB. The NAND gate 172 outputs the internal logic signal AXB17 in response to the inverted block size change signal BKERB and the page address signal AX17. The NAND gate 173 outputs the internal logic signal AXO17 in response to the internal logic signal AXB17 and the inverted block size change signal BKERB.

The second logic calculation unit 122 logically calculates the internal logic signals AXB13 to AXB17, and AXO13 to AXO17 and outputs selection signals SEL1 to SEL32 according to the calculation result. In more detail, the second logic calculation unit 122 includes calculation logic circuits SLC1 to SLC32. Each of the calculation logic circuits SLC1 to SLC32 outputs one of the selection signals SEL1 to SEL32 in response to a part of the internal logic signals AXB13 to AXB17, and AXO13 to AXO17. For example, the calculation logic circuit SLC1 may generate the selection signal SEL1 in response to the internal logic signals AXB13 to AXB17. The calculation logic circuit SLC2 may generate the selection signal SEL2 in response to the internal logic signals AXO13, and AXB14 to AXB17. Furthermore, the calculation logic circuit SLC3 may generate the selection signal SEL3 in response to the internal logic signals AXB13, AXO14, and AXB15 to AXB17. The calculation logic circuit SLC32 may generate the selection signal SEL32 in response to the internal logic signals AXO13 to AXO17. Each of the calculation logic circuits SLC1 to SLC32 includes NAND gates 181 and 182 and a NOR gate 183. The calculation logic circuits SLC1 to SLC32 have the same structure and operation and only the operation of the calculation logic circuit SLC1 will be described as an example. The NAND gate 181 of the calculation logic circuit SLC1 outputs a logic signal FL1 in response to the internal logic signals AXB13 to AXB15. The NAND gate 182 outputs a logic signal SL2 in response to the internal logic signals AXB16, AXB17. The NOR gate 183 outputs the selection signal SEL1 in response to the logic signals FL1, SL1.

Meanwhile, internal logic signals inputted to the calculation logic circuits SLC2 to SLC15 existing between the calculation logic circuit SLC16 and the calculation logic circuit SLC1 on both sides of the calculation logic circuit SLC16 will be described below. It can be seen that calculation logic circuits close to the calculation logic circuit SLC1 have more internal logic signals AXB13 to AXB17 than the internal logic signals AXO13 to AXO17. Furthermore, internal logic signals inputted to the calculation logic circuits SLC17 to SLC31 existing between the calculation logic circuit SLC16 and the calculation logic circuit SLC32 will be described below. It can be seen that calculation logic circuits close to the calculation logic circuit SLC32 have more internal logic signals AXO13 to AXO17 than the internal logic signals AXB13 to AXB17. For convenience of description, internal logic signals respectively inputted to the NAND gates 181, 182 of each of the calculation logic circuits SLC1 to SLC32 can be represented into the following table.

TABLE 1

| Calculation logic circuit | NAND gate 181 | NAND gate 182 |
|---|---|---|
| SLC1 | AXB13, AXB14, AXB15 | AXB16, AXB17 |
| SLC2 | AXO13, AXB14, AXB15 | AXB16, AXB17 |
| SLC3 | AXB13, AXO14, AXB15 | AXB16, AXB17 |
| SLC4 | AXO13, AXO14, AXB15 | AXB16, AXB17 |
| SLC5 | AXB13, AXB14, AXO15 | AXB16, AXB17 |
| . | . | . |
| . | . | . |
| . | . | . |
| SLC16 | AXO13, AXO14, AXO15 | AXO16, AXB17 |
| . | . | . |
| . | . | . |
| . | . | . |
| SLC32 | AXO13, AXO14, AXO15 | AXO16, AXO17 |

The voltage selection units SV1 to SV32 select the program voltage VPGM, the program pass voltage VPASS, the read voltage VRD, the read pass voltage VRP, the erase voltage VER, and the erase-prohibition voltage VERP, respectively, in response to the program command PGM, the read command READ, one of the erase command ERS, and the selection signals SEL1 to SEL32, and outputs the selected voltages to the global word lines GWL1 to GWL32, respectively. The voltage selection units SV1 to SV32 have the same structure and operation, and only the structure and operation of the voltage selection unit SV1 will be therefore described as an example.

The voltage selection unit SV1 includes selection circuits SW1 to SW3. The selection circuit SW1 selects one of the erase voltage VER and the erase-prohibition voltage VERP and outputs a selected voltage to the global word line GWL1, in response to the selection signal SELL and the erase command ERS. In more detail, when the selection circuit SW1 receives the erase command ERS and the selection signal SEL1 is enabled, the selection circuit SW1 selects the erase voltage VER and outputs it to the global word line GWL1. Furthermore, when the selection circuit SW1 receives the erase command ERS and the selection signal SEL1 is disabled, the selection circuit SW1 selects the erase-prohibition voltage VERP and outputs it to the global word line GWL1. The selection circuit SW2 selects one of the program voltage VPGM and the program pass voltage VPASS and outputs it to the global word line GWL1, in response to the selection signal SEL1 and the program command PGM. In more detail, when the selection circuit SW2 receives the program command PGM and the selection signal SEL1 is enabled, the selection circuit SW2 selects the program voltage VPGM. When the selection signal SEL1 is disabled, the selection circuit SW2 selects the program pass voltage VPASS. Furthermore, the selection circuit SW3 selects one of the read voltage VRD and the read pass voltage VRP and outputs a selected voltage to the global word line GWL1, in response to the selection signal SEL1 and the read command READ. In more detail, when the selection circuit SW3 receives the read command READ and the selection signal SEL1 is enabled, the selection circuit SW3 selects the read voltage VRD. When the selection signal SEL1 is disabled, the selection circuit SW2 selects the read pass voltage VRP.

Figure 4:
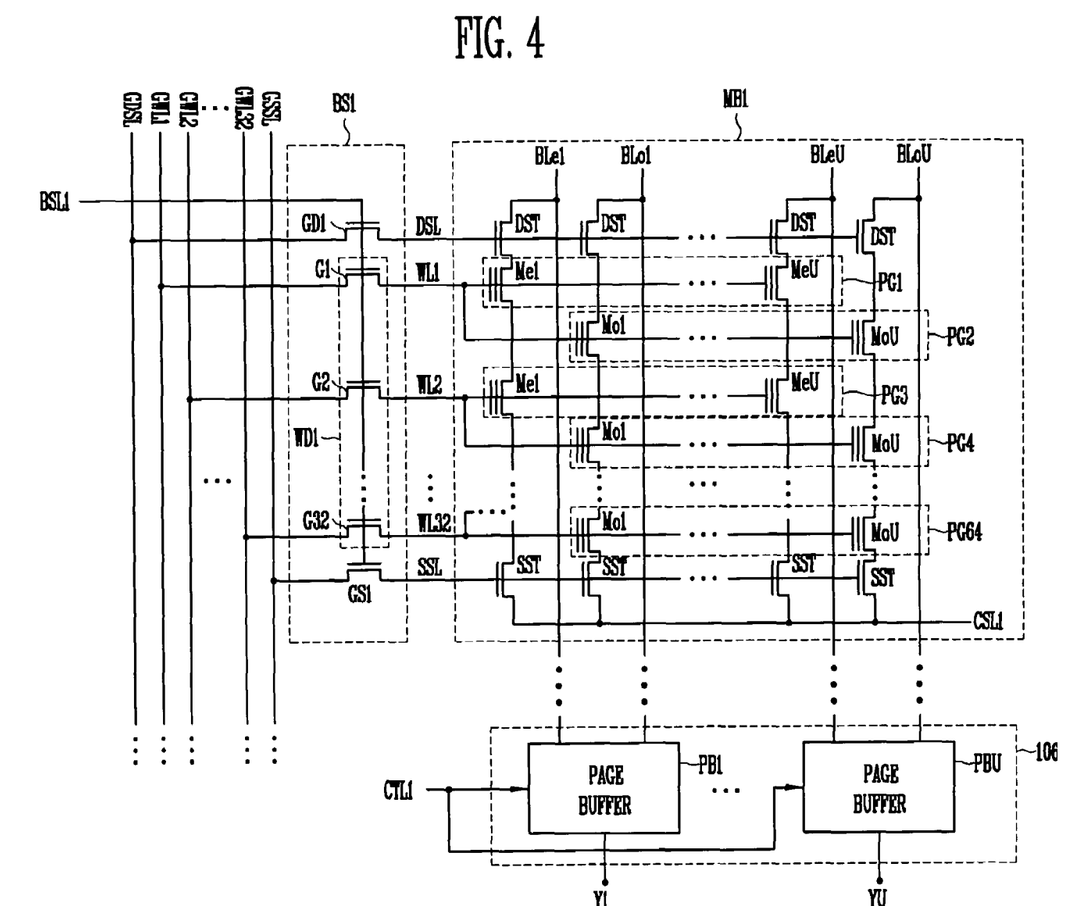
FIG. 4 is a detailed circuit diagram of a block selection unit, a memory cell block, and a page buffer unit shown in FIG. 2.

FIG. 4 is a detailed circuit diagram of the block selection unit, the memory cell block, and the page buffer unit shown in FIG. 2. Referring to FIG. 4, the block selection unit BS1 includes a drain select line driver GD1, a word line driver WD1, and a source select line driver GS1.

The drain select line driver GD1 outputs the drain bias voltage VGD, which is received from the global drain select line GDSL, to a drain select line DSL of the memory cell block MB1 in response to the block selection signal BSL1. The word line driver WD1 outputs a word line bias voltage VGW, which is received from the global word lines GWL1 to GWL32, to local word lines WL1 to WL32 of the memory cell block MB1, respectively, in response to the block selection signal BSL1

The word line driver WD1 includes switch circuits G1 to G32. The switch circuits G1 to G32 are connected between the global word lines GWL1 to GWL32 and the local word lines WL1 to WL32, respectively, and are turned on or off in response to the block selection signal BSL1. Preferably, each of the switch circuits G1 to G32 may be implemented using a NMOS transistor. For example, when the switch circuit G1 is implemented using a NMOS transistor, the NMOS transistor G1 has a source connected to the global word line GWL1, a drain connected to the local word line WL1, and a gate to which the block selection signal BSL1 is inputted.

The source select line driver GS1 outputs the source bias voltage VGS, which is received through the global source select line GSSL, to the source select line SSL of the memory cell block MB1 in response to the block selection signal BSL1. The memory cell block MB1 includes a plurality of pages PG1 to PG64, drain select transistors DSTs, and source select transistors SSTs. The plurality of pages PG1 to PG64 form a plurality of page pairs PG1 and PG2, PG3 and PG4, ..., PG63 and PG64 in such a manner than neighboring two pages form a pair. In this case, a pair of pages (for example, PG1 and PG2) share one local word line WL1. Furthermore, each of the pages PG1, PG3, PG5, ..., PG63 includes memory cells Me1 to MeU (U is an integer) and each of the pages PG2, PG4, PG6, ..., PG64 shares memory cells Mo1 to MoU (U is an integer). The drain select transistors DSTs share the drain select line DSL and are connected to the memory cells Me1 to MeU and Mo1 to MoU, which are included in the pages PG1 and PG2, respectively. Furthermore, the drain select transistors DSTs are connected to the bit lines BLe1, BLo1 to BLeU, and BLoU, respectively. The source select transistors SSTs share the source select line SSL and a common source line CSL1 and are connected to the memory cells Me1 to MeU and Mo1 to MoU, which are included in the pages PG63 (not shown) and PG64, respectively.

The page buffer unit 106 includes page buffers PB1 to PBU. The page buffers PB1 to PBU are connected to pairs of bit lines, respectively, and are also connected to data I/O nodes Y1 to YU (U is an integer), respectively. For example, the page buffer PB1 may be connected to bit lines BLe1, BLo1. The page buffers PB1 to PBU select the bit lines BLe1 to BLeU or the bit lines BLo1 to BloU, respectively, in response to the control signal CTL1 received from the Y-decoder 105. As a result, during the program or read operation of the flash memory device 100, the page buffers PB1 to PBU select a page (one of PG1, PG3, PG5, . . . , PG63) connected to the bit line BLe1 to BleU and a page (one of PG2, PG4, PG6, . . . , PG64) connected to the bit lines BLo1 to BLoU.

The erase operation process of the flash memory device 100 will be described in detail below. The input buffer 101 receives the command signal CMD1 and outputs it to the control logic circuit 102. The control logic circuit 102 receives the command signal CMD1 in response to the control signals CEb, REb, WEb, ALE, and CLE and generates the erase command ERS in response to the command signal CMD1. The high-voltage generator 103 generates the erase voltage VER (for example, 0V) and the erase-prohibition voltage VERP and does not generate the drain bias voltage VGD and the source bias voltage VGS in response to the erase command ERS. That is, the high-voltage generator 103 floats the global drain select line GDSL and the global source select line GSSL.

Furthermore, the input buffer 101 receives the command signal CMD2 and outputs it to the control logic circuit 102. The control logic circuit 102 receives the command signal CMD2 in response to the control signals CEb, REb, WEb, ALE, and CLE and generates the block size change signals ER4, ER8, ER16, ER32, and BKER in response to the command signal CMD2. Preferably, the command signal CMD2 includes size information about an erased memory cell block. Accordingly, the control logic circuit 102 can selectively change a logic status of each of the block size change signals ER4, ER8, ER16, ER32, and BKER according to size information of the memory cell block, which is included in the command signal CMD2, and outputs a changed logic status. In this case, the size of an erased memory cell block may be changed depending on a logic status of the block size change signals ER4, ER8, ER16, ER32, and BKER.

In the present embodiment, an example in which the size of an erased memory cell block is four pages will be described. In this case, the control logic circuit 102 outputs the block size change signal ER4 as a logical high and outputs the block size change signals ER8, ER16, ER32, and BKER as logical low. Meanwhile, the input buffer 101 receives the external address signals ADD0 to ADDF and outputs them to the control logic circuit 102. The control logic circuit 102 receives the external address signals ADD0 to ADDF in response to the control signals CEb, REb, WEb, ALE, and CLE and generates the block address signals AX18 to AX27 and the page address signals AX13 to AX17 based on the external address signals ADD0 to ADDF.

The block decoder 110 of the X-decoder 104 decodes the block address signals AX18 to AX27, enables at least one (for example, BSL1) of the block selection signals BSL1 to BSLK and disables the remaining block selection signals, according to the decoding result. Preferably, a voltage of the enabled block selection signal BSL1 may be higher than the erase-prohibition voltage VER. The word line decoder 120 of the X-decoder 104 outputs the erase voltage VER to a part of the global word lines GWL1 to GWL32 and outputs the erase-prohibition voltage VERP to the remaining global word lines, in response to the erase command ERS, the block size change signals ER4, ER8, ER16, ER32, and BKER, and the page address signals AX13 to AX17.

In more detail, the first logic calculation unit 121 of the word line decoder 120 outputs the internal logic signals AXB13 to AXB17, and AXO13 to AXO17 in response to the block size change signals ER4, ER8, ER16, ER32, and BKER, and the page address signals AX13 to AX17. In more detail, since the block size change signal ER4 is logical high, the logic circuit 130 of the first logic calculation unit 121 outputs the internal logic signals AXB13, AXO13 as a logical high regardless of a logic level of the page address signal AX13. Furthermore, since the block size change signals ER8, ER16, ER32, and BKER are logical low, the logic circuits 140 to 170 of the first logic calculation unit 121 output the internal logic signals AXB14 to AXB17 and AXO14 to AXO17 according to logic states of the page address signals AX14 to AX17.

For example, when all the page address signals AX14 to AX17 are logical low, the first logic calculation unit 121 outputs all the internal logic signals AXB14 to AXB17 as logical high and all the internal logic signals AXO14 to AXO17 as logical low. As a result, the second logic calculation unit 121 of the word line decoder 120 enables the selection signals SEL1, SEL2 and disables the selection signals SEL3 to SEL32, in response to the internal logic signals AXO13 to AXO17 and AXB13 to AXB17. The voltage selection units SV1, SV2 of the word line decoder 120 output the erase voltage VER to each of the global word lines GWL1, GWL2 in response to the erase command ERS and the selection signals SEL1, SEL2, respectively. Furthermore, the voltage selection units SV3 to SV32 of the word line decoder 120 output the erase-prohibition voltage VERP to each of the global word lines GWL3 to GWL32 in response to the selection signals SEL3 to SEL32 and the erase command ERS.

Meanwhile, the drain select transistor GD1 of the block selection unit BS1 connects the global drain select line GDSL to the drain select line DSL in response to the block selection signal BSL1. Furthermore, the source select transistor GS1 of the block selection unit BS1 connects the global source select line GSSL to the source select line SSL in response to the block selection signal BSL1. The word line driver WD1 of the block selection unit BS1 connects a part of the global word lines GWL1 to GWL32 to a part of the local word lines WL1 to WL32. In more detail, switch circuits (i.e., NMOS transistors) G1, G2 of the word line driver WD1 connect the global word lines GWL1, GWL2 to the local word lines WL1, WL2, respectively, in response to the block selection signal BSL1. However, switch circuits (i.e., NMOS transistors) G3 to G32 of the word line driver WD1 separate the global word lines GWL3 to GWL32 from the local word lines WL3 to WL32, respectively.

This is because the erase-prohibition voltage VERP applied to the global word lines GWL3 to GWL32 to which the sources of the NMOS transistors G3 to G32 are connected is higher than the voltage of the block selection signal BSL1 supplied to the gates of the NMOS transistors G3 to G32 are connected. That is, when the voltages of the gates of the NMOS transistors G3 to G32 are higher than those of the sources of the NMOS transistors G3 to G32, the NMOS transistors G3 to G32 are turned on. Since the NMOS transistors G1, G2 are turned on and the NMOS transistors G3 to G32 are turned off, the local word lines WL1, WL2 are supplied with the erase voltage VER (0V) and the local word lines WL3 to WL32 are floated. At this time, the block selection units BS2 to BSK separate the global word lines GWL1 to GWL32, the global drain select line GDSL, and the global source select line GSSL from the memory cell blocks MB2 to MBK, respectively, in response to the block selection signals BSL2 to BSLK. As a result, the memory cell block MB1 is selected as a memory cell block to be erased.

Thereafter, a high voltage (for example, 20V) is applied to P-wells of the memory cells Me1 to MeU and Mo1 to MoU included in the memory cell block MB1. As a result, data stored in memory cells included in the pages PG1 to PG4 connected to the local word lines WL1 and WL2 to which the erase voltage VER (0V) is applied are erased. At this time, since the voltages of the floated local word lines WL3 to WL32 are boosted by the high voltage applied to the P-well, data stored in the memory cells respectively connected to the local word lines WL3 to WL32 are not erased.

Consequently, although the memory cell block MB1 including 64 page is selected as an erase block, the erase voltage VER is applied to only the global word lines GWL1, GWL2. Therefore, the size of the erased memory cell block is changed to four pages, as indicated by "B" in FIG. 2. As can be seen from the above embodiment, the size of an erased memory cell block is decided depending on a word line bias voltage applied to the global word line during the erase operation.

In the above, an example in which all the page address signals AX14 to AX17 are logical low (i.e., the pages PG1 to PG4 connected to the local word lines WL1, WL2 are selected as an erased memory cell block) has been described. However, four pages (for example, PG61 to PG64) may be selected as erased memory cell blocks depending on logic states of the page address signals AX14 to AX17.

Furthermore, if the size of an erased memory cell block is four pages as described above, the word line decoder 10 outputs the erase voltage VER to two of the global word lines GWL1 to GWL32 according to logic states of the page address signals AX14 to AX17 regardless of a logic state of the page address signal AX13. Accordingly, when the size of erased memory cell block is four pages, the page address signals AX14 to AX17 are used as block address signals for selecting the erased memory cell block.

In the above, an example in which the size of an erase memory cell block is four pages (i.e., an example in which four pages are erased) has been described. The size of the memory cell block may be changed in various ways during the erase operation depending on logic states of the block size change signals ER4, ER8, ER16, ER32, and BKER and the page address signals AX13 to AX17. For example, when the block size change signal BKER is logical high, the first logic calculation unit 121 outputs all the internal logic signals AXB13 to AXB17 and AXO13 to AXO17 as logical high regardless of logic states of the page address signals AX13 to AX17. Accordingly, the second logic calculation unit 121 enables all the selection signals SEL1 to SEL32 in response to the internal logic signals AXB13 to AXB17 and AXO13 to AXO17. The voltage selection units SV1 to SV32 output the erase voltage VER to the global word lines GWL1 to GWL32, respectively, in response to the selection signals SEL1 to SEL32, respectively. In this case, the size of the erased memory cell block becomes 64 pages, as indicated by "F" in FIG. 2.

Furthermore, for example, when all the block size change signals ER4, ER8, ER16, ER32, and BKER are logical low, the size of the erased memory cell block becomes two pages, as indicated by "A" in FIG. 2. In this case, two of the pages PG1 to PG64 are selected according to logic states of the page address signals AX13 to AX17. As a result, when the size of the erased memory cell block is two pages, a memory cell block to be erased by the page address signals AX13 to AX17 is selected. Accordingly, the page address signals AX13 to AX17 are used as the block address signals.

In a similar way, when only the block size change signal ER8 becomes logical high, the size of the erased memory cell block becomes 8 pages, as indicated by "C" in FIG. 2. In this case, 8 pages of the pages PG1 to PG64 are selected according to logic states of the page address signals AX15 to AX17. As a result, when the size of the erased memory cell block is 8 pages, a memory cell block to be erased by the page address signals AX15 to AX17 is selected. Therefore, the page address signals AX15 to AX17 are used as the block address signals.

Furthermore, when only the block change signal ER16 becomes logical high, the size of the erased memory cell block becomes 16 pages, as indicated by "D" in FIG. 2. In this case, 16 pages of the pages PG1 to PG64 are selected according to logic states of the page address signals AX16, AX17. As a result, when the size of the erased memory cell block is 16 pages, a memory cell block to be erased by the page address signals AX16, AX17 is selected. Therefore, the page address signals AX16, AX17 are used as the block address signals.

In addition, when only the block change signal ER32 becomes logical high, the size of the erased memory cell block becomes 32 pages, as indicated by "E" in FIG. 2. In this case, 32 pages of the pages PG1 to PG64 are selected according to a logic state of the page address signal AX17. As a result, when the size of the erased memory cell block is 32 pages, a memory cell block to be erased by the page address signal AX17 is selected. Therefore, the page address signal AX17 is used as the block address signal.

Figure 5:
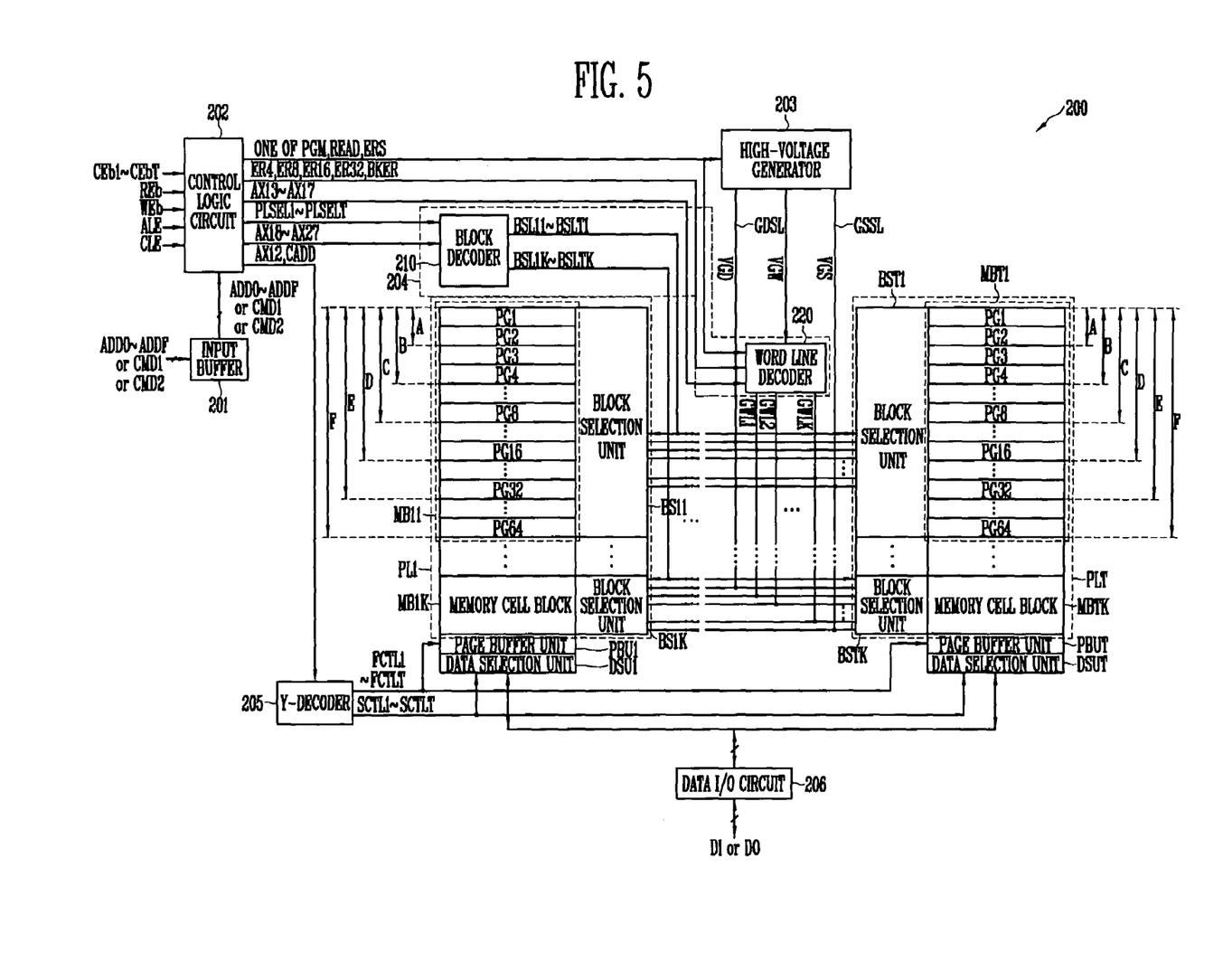
FIG. 5 is a block diagram showing the structure of a flash memory device according to another embodiment of the present invention.

FIG. 5 is a block diagram showing the structure of a flash memory device according to another embodiment of the present invention.

Referring to FIG. 5, a flash memory device 200 includes a plurality of planes PL1 to PLT (T is an integer), an input buffer 201, a control logic circuit 202, a high-voltage generator 203, an X-decoder 204, a Y-decoder 205, page buffer units PBU1 to PBUT, data selection units DSU1 to DSUT, and a data I/O circuit 206.

Each of the plurality of planes PL1 to PLT includes memory cell blocks and block selection units. For example, the plane PL1 may include memory cell blocks MB11 to MB1K and block selection units BS11 to BS1K. The X-decoder 204 includes a block decoder 210 and a word line decoder 220. The flash memory device 200 has the same structure and operation as those of the flash memory device 100. Accordingly, differences between the flash memory devices 200, 100 will be descried in the present embodiment in order to avoid redundancy.

The control logic circuit 202 outputs one of plane selection signals PLSEL1 to PLSELT in response to one of external control signal (i.e., chip enable signals CEb1 to CebT) (T is an integer). The block decoder 210 generates a group of block selection signal groups (one of groups BSL11 to BSL1K to BSLT1 to BSLTK) in response to one of the plane selection signals PLSEL1 to PLSELT. Block selection units of one of the planes PL1 to PLT are driven in response to block selection signals (one of the groups BSL11 to BSL1K to BSLT1 to BSLTK) generated by the block decoder 210. As a result, during the erase operation of the flash memory device 200, the erase operation of one of the planes PL1 to PLT can be performed.

Alternatively, a part of or all the chip enable signals CEb1 to CebT may be inputted to the control logic circuit 202. In this case, the control logic circuit 202 outputs a part of or all the plane selection signals PLSEL1 to PLSELT in response to a part of or all the chip enable signals CEb1 to CebT. The block decoder 210 generates block selection signals of some groups (a part of the groups BSL11 to BSL1K to BSLT1 to BSLTK) or block selection signals of the whole groups in response to a part of or all the plane selection signals PLSEL1 to PLSELT. As a result, during the erase operation of the flash memory device 200, the erase operation of a part of or all the planes PL1 to PLT can be executed. The construction and operation of each of the page buffer units PBU1 to PBUT are the same as those of the page buffer unit 106 and the construction and operation of each of the data selection units DSU1 to DSUT are the same as those of the data selection unit 107.

As described above, in accordance with a flash memory device and an erase method thereof according to the present invention, the size of a memory cell block can be changed selectively by changing the number of global word lines to which an erase voltage is applied according to block size change signals during an erase operation without changing its physical structure. Accordingly, the size of a memory cell block of a flash memory device can be changed in various ways depending on operating characteristics of products.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flash memory device comprising:
   a plurality of memory cell blocks, each of the plurality of cell blocks including a plurality of pages, each of the plurality of pages having a plurality of memory cells;
   an X-decoder for decoding block address signals, page address signals, and block size change signals in response to one of a program command, a read command, and an erase command, generating a plurality of block selection signals and word line bias voltages according to the decoding result, and outputting the word line bias voltages to a plurality of global word lines, respectively; and
   a plurality of block selection units, each of the plurality of block selection units connected to one of the plurality of memory cell blocks and connecting the plurality of global word lines, a global drain select line, and a global source select line to each of the plurality of memory cell blocks, in response to one of the plurality of block selection signals,
   wherein during an erase operation of the flash memory device, at least one of the plurality of block selection units selects at least one of the plurality of memory cell blocks, and the X-decoder outputs the word line bias voltages such that at least two of the plurality of pages included in at least one memory cell block are selected during the erase operation.

2. The flash memory device of claim 1, further comprising:
   a control logic circuit that receives one of a first command signal, a second command signal, and external address signals in response to external control signals; and
   an input buffer that receives the first command signal, the second command signal, and the external address signals and outputs the received signals to the control logic circuit.

3. The flash memory device of claim 2, wherein the control logic circuit generates one of the program command, the read command, and the erase command in response to the first command signal and generates the block size change signals in response to the second command signal.

4. The flash memory device of claim 2, wherein the control logic circuit generates the block address signals, the page address signals, and column address signals based on the external address signals.

5. The flash memory device of claim 1, further comprising a high-voltage generator that generates the word line bias voltages, a drain bias voltage, and a source bias voltage corresponding to any one of a program operation, a read operation, and an erase operation of the flash memory device, and outputs the word line bias voltages to the X-decoder, the drain bias voltage to the global drain select line, and the source bias voltage to the source select line, in response to one of the program command, the read command, and the erase command.

6. The flash memory device of claim 3, wherein during the program operation of the flash memory device, the word line bias voltages include a program voltage and a program pass voltage, during the read operation of the flash memory device, the word line bias voltages includes a read voltage and a read pass voltage, and during the erase operation of the flash memory device, the word line bias voltages include an erase voltage and an erase-prohibition voltage.

7. The flash memory device of claim 6, wherein the X-decoder comprises:
   a block decoder that decodes the block address signals and generates the plurality of block selection signals; and
   a word line decoder that decodes the page address signals and the block change signals in response to one of the program command, the read command, and the erase command, and outputs the word line bias voltages corresponding to one of the program operation, the read operation, and the erase operation to the plurality of global word lines,
   wherein the word line decoder outputs the erase voltage to all the plurality of global word lines or the erase voltage to at least one of the plurality of global word lines and outputs the erase-prohibition voltage to the remaining global word lines, according to the decoding result of the page address signals and the block change signals during the erase operation.

8. The flash memory device of claim 7, wherein during the erase operation, the block decoder enables at least one of the plurality of block selection signals and disables the remaining block selection signals, and
   the erase-prohibition voltage is higher than a voltage of the at least one block selection signal that is enabled.

9. The flash memory device of claim 7, wherein the word line decoder comprises:
   a first logic calculation unit that logically calculates the page address signals and the block change signals and outputs internal logic signals;
   a second logic calculation unit that logically calculates the internal logic signals and outputs selection; and
   a plurality of voltage selection units that select one of the program voltage, the program pass voltage, the read voltage, the read pass voltage, the erase voltage, and the erase-prohibition voltage, and output selected voltages to the plurality of global word lines in response to one of the program command, the read command, and the erase command and the selection signals.

10. The flash memory device of claim 9, wherein each of the plurality of voltage selection units receives the erase command during the erase operation, selects the erase voltage when a selection signal corresponding to the voltage selection unit is enabled, and selects the erase-prohibition voltage when a selection signal corresponding to the voltage selection unit is disabled, and a voltage of an enabled selection signal is higher than the erase-prohibition voltage.

11. A flash memory device comprising:

a plurality of planes; and an X-decoder that decodes block address signals, page address signals, and block size change signals in response to one of a program command, a read command, and an erase command and a plane selection signal, generates word line bias voltages and block selection signals according to the decoding result, and outputs the word line bias voltages to a plurality of global word lines, wherein each of the plurality of planes comprises:

a plurality of memory cell blocks, each of the plurality of memory cell blocks including a plurality of pages, each of the plurality of pages having a plurality of memory cells; and a plurality of block selection units, each of the block selection units connected to one of the plurality of memory cell blocks, for connecting the plurality of global word lines, a global drain select line, and a global source select line to one of the plurality of memory cell blocks, in response to a block selection signal, wherein during an erase operation of the flash memory device, at least one of the plurality of block selection units selects at least one of the plurality of memory cell blocks, and the X-decoder outputs the word line bias voltages such that at least two of the plurality of pages included in the at least one memory cell block are selected during the erase operation.

12. The flash memory device of claim 11, further comprising:

a control logic circuit that outputs the plane selection signal in response to a chip enable signal and receives one of a first command signal, a second command signal, and external address signals in response to external control signals; and an input buffer that receives the first command signal, the second command signal, and the external address signals and outputs the received signals to the control logic circuit 13. The flash memory device of claim 12, wherein the control logic circuit generates one of the program command, the read command, and the erase command in response to the first command signal and generates the block size change signals in response to the second command signal.

14. The flash memory device of claim 12, wherein the control logic circuit generates the block address signals, the page address signals, and column address signals based on the external address signals.

15. The flash memory device of claim 11, wherein during the program operation of the flash memory device, the word line bias voltages include a program voltage and a program pass voltage, during the read operation of the flash memory device, the word line bias voltages includes a read voltage and a read pass voltage, and during the erase operation of the flash memory device, the word line bias voltages include an erase voltage and an erase-prohibition voltage.

16. The flash memory device of claim 15, wherein the X-decoder comprises:

a block decoder that decodes the block address signals in response to the plane selection signal and generates block selection signals; and a word line decoder that decodes the page address signals and the block change signals in response to one of the program command, the read command, and the erase command, and outputs the word line bias voltages corresponding to one of the program operation, the read operation, and the erase operation to the plurality of global word lines, wherein the word line decoder outputs the erase voltage to all the plurality of global word lines or the erase voltage to at least one of the plurality of global word lines and outputs the erase-prohibition voltage to the remaining global word lines, according to the decoding result of the page address signals and the block change signals during the erase operation.

17. The flash memory device of claim 16, wherein during the erase operation, the block decoder enables at least one of block selection signals and disables the remaining block selection signals, and the erase-prohibition voltage is higher than a voltage of the at least one block selection signal that is enabled.

18. The flash memory device of claim 16, wherein the word line decoder comprises:

a first logic calculation unit that logically calculates the page address signals and the block change signals and output internal logic signals;

a second logic calculation unit that logically calculates the internal logic signals and outputs selection; and a plurality of voltage selection units that select one of the program voltage, the program pass voltage, the read voltage, the read pass voltage, the erase voltage, and the erase-prohibition voltage, and output selected voltages to the plurality of global word lines in response to one of the program command, the read command, and the erase command and the selection signals.

19. The flash memory device of claim 18, wherein each of the plurality of voltage selection units receives the erase command during the erase operation, selects the erase voltage when a selection signal corresponding to the voltage selection unit is enabled, and selects the erase-prohibition voltage when a selection signal corresponding to the voltage selection unit is disabled, and a voltage of an enabled selection signal is higher than the erase-prohibition voltage.

20. An erase method of a flash memory device, comprising the steps of:

generating an erase command in response to a first command signal;

generating block size change signals in response to a second command signal;

generating block address signals and page address signals based on external address signals; and selecting the size of an erase memory cell block and erasing the erase memory cell block, in response to the erase command, the block size change signals, the block address signals, and the page address signals.

21. The method of claim 20, wherein the erasing step comprises the steps of:

decoding the block address signals, and selecting at least one of a plurality of memory cell blocks according to the decoding result;

decoding the block size change signals and the page address signals in response to the erase command, and selecting at least two of a plurality of pages included in the at least one memory cell block; and supplying a high voltage to P-wells of a plurality of memory cells included in the plurality of pages, thereby erasing at least two of the plurality of the selected pages.

22. The method of claim 21, wherein the step of selecting the at least one memory cell block comprises the steps of:
- decoding the block address signals and enabling at least one of a plurality of block selection signals according to the decoding result; and
- connecting a global drain select line and a global source select line to a drain select line and a source select line of the at least one memory cell block in response to the at least one block selection signal.

23. The method of claim 22, wherein the step of selecting at least two of the plurality of pages comprises the steps of:
- generating an erase voltage and an erase-prohibition voltage in response to the erase command;
- decoding the block size change signals and the page address signals in response to the erase command;
- outputting the erase voltage to at least one of a plurality of global word lines according to the decoding results of the block size change signals and the page address signals;
- outputting the erase-prohibition voltage to the remaining global word lines according to the decoding results of the block size change signals and the page address signals;
- connecting the global word lines to which the erase voltage is applied to first local word lines in response to the at least one block selection signal such that the erase voltage is applied to the first local word lines; and
- separating global word lines to which the erase-prohibition voltage is applied from second local word lines in response to the at least one block selection signal so that second local word lines connected to the remaining pages float.

24. The method of claim 23, wherein the erase-prohibition voltage is higher than the erase voltage and is higher than a voltage of the at least one enabled block selection signal.

25. The method of claim 22, wherein the step of selecting all the plurality of pages comprises the steps of:
- generating an erase voltage in response to the erase command;
- decoding the block size change signals and the page address signals in response to the erase command;
- outputting the erase voltage to all of a plurality of global word lines according to the decoding results of the block size change signals and the page address signals; and
- connecting the plurality of global word lines to local word lines in response to the at least one block selection signal such that the erase voltage is applied to local word lines connected to the plurality of pages.

26. A flash memory device comprising:
- a plurality of memory cell blocks, each of the memory cell blocks including pages connected to local word lines;
- a control logic circuit configured to generate a plurality of block size change signals to determine a size of the memory cell block to be erased;
- an X-decoder configured to generate a plurality of block selection signals, the X-decoder for transferring an erase voltage to at least one of global word lines and transferring an erase-prohibition voltage to the remaining global word lines, according to the block size change signals; and
- block selection units for connecting the global word lines to the local word lines of a selected memory cell block.

27. The flash memory device of claim 26, wherein the block size change signals are generated to define a number of the pages to be erased.

28. The flash memory device of claim 26, wherein the control logic circuit further generates a plurality of block address signals and a plurality of page address signals.

29. The flash memory device of claim 28, wherein the X-decoder comprises:
- a block decoder that generates the block selection signals according to the block address signals; and
- a word line decoder that transfers the erase voltage to at least one of the global word lines and the erase-prohibition voltage to the remaining global word lines according to the block size change signals and the page address signals.

30. The flash memory device of claim 26, wherein two pages are connected to one local word line.

31. An erase method of a flash memory device, comprising the steps of:
- providing a memory cell block, the memory cell block including a plurality of pages, each of the pages including a plurality of memory cells;
- generating a plurality of block size change signals to determine a size of the memory cell block to be erased; and
- supplying an erase voltage to the pages included in an erasing portion of the memory cell block and supplying an erase-prohibition voltage to the remaining pages according to the block size change signals.

32. The method of claim 31, wherein the erase voltage is supplied to at least two of the pages.

33. The method of claim 31, wherein a voltage is supplied to a P-well of the memory cells included in the memory cell block, when the erase voltage and the erase-prohibition voltage are supplied.

34. An erase method of a flash memory device, comprising the steps of:
- providing a memory cell block, the memory cell block including a plurality of pages, each of the pages including a plurality of memory cells;
- determining a number of pages to be erased; and
- supplying an erase voltage to the pages to be erased and supplying and erase-prohibition voltage to the pages not to be erased.

35. The method of claim 33, wherein the erase voltage is supplied to at least two of the pages.

36. The method of claim 34, wherein a voltage is supplied to a P-well of the memory cells included in the memory cell block, when the erase voltage and the erase-prohibition voltage are supplied.

* * * * *